United States Patent
Connors et al.

(10) Patent No.: US 9,417,015 B2
(45) Date of Patent: Aug. 16, 2016

(54) HEAT EXCHANGER BACKING PLATE AND METHOD OF ASSEMBLING SAME

(71) Applicant: Thermal Corp., Wilmington, DE (US)

(72) Inventors: Matt Connors, Lancaster, PA (US); Jerome E. Toth, Exton, PA (US)

(73) Assignee: Thermal Corp., Wilmington, DE (US)

( * ) Notice: Subject to any disclaimer, the term of this patent is extended or adjusted under 35 U.S.C. 154(b) by 294 days.

(21) Appl. No.: 13/772,622

(22) Filed: Feb. 21, 2013

(65) Prior Publication Data

US 2013/0213603 A1    Aug. 22, 2013

Related U.S. Application Data

(60) Provisional application No. 61/601,585, filed on Feb. 22, 2012.

(51) Int. Cl.
| | |
|---|---|
| *F28F 3/00* | (2006.01) |
| *B23P 15/26* | (2006.01) |
| *F28F 3/02* | (2006.01) |
| *F28F 3/12* | (2006.01) |
| *F28D 15/02* | (2006.01) |
| *H01L 23/427* | (2006.01) |
| *H01L 23/36* | (2006.01) |
| *H01L 23/40* | (2006.01) |

(52) U.S. Cl.
CPC . *F28F 3/00* (2013.01); *B23P 15/26* (2013.01); *F28D 15/0233* (2013.01); *F28F 3/025* (2013.01); *F28F 3/12* (2013.01); *H01L 23/36* (2013.01); *H01L 23/4006* (2013.01); *H01L 23/427* (2013.01); *H01L 2924/0002* (2013.01); *Y10T 29/4935* (2015.01); *Y10T 29/49378* (2015.01); *Y10T 29/49396* (2015.01); *Y10T 29/49947* (2015.01); *Y10T 29/49963* (2015.01)

(58) Field of Classification Search
CPC ............... F28F 3/00; F28F 3/025; F28F 3/12; H01L 23/36; H01L 23/4006; H01L 23/427; H01L 2924/0002; F28D 15/0233; B23P 15/26; Y10T 29/4935; Y10T 29/4936; Y10T 29/49947; Y10T 29/49963; Y10T 29/49396; Y10T 29/49378
See application file for complete search history.

(56) References Cited

U.S. PATENT DOCUMENTS

| | | | |
|---|---|---|---|
| 3,536,960 A * | 10/1970 | Otteson et al. ................. | 361/707 |
| 5,662,163 A | 9/1997 | Mira | |
| 5,838,064 A | 11/1998 | Shimada et al. | |
| 5,880,524 A | 3/1999 | Xie | |
| 6,367,543 B1 | 4/2002 | Calaman et al. | |
| 6,459,582 B1 | 10/2002 | Ali et al. | |
| 6,650,544 B1 | 11/2003 | Lai | |
| 6,679,318 B2 | 1/2004 | Bakke | |
| 7,028,760 B2 | 4/2006 | Dussinger et al. | |
| 7,068,513 B1 | 6/2006 | Xia et al. | |
| 7,100,679 B2 | 9/2006 | Dussinger et al. | |

(Continued)

FOREIGN PATENT DOCUMENTS

JP    2002062068    2/2002

*Primary Examiner* — John C Hong
(74) *Attorney, Agent, or Firm* — Michael Best & Friedrich LLP

(57) ABSTRACT

A backing plate for joining a heat removal device to a heat source. The backing plate can include a planar plate region having a first face and a second face opposite the first face. The backing plate can also include at least one boss projecting from the first face and having an opening therein for receiving a fastener.

24 Claims, 3 Drawing Sheets

(56) References Cited

U.S. PATENT DOCUMENTS

| | | |
|---|---|---|
| 7,679,912 B1 | 3/2010 | Xiong et al. |
| 7,697,293 B1 | 4/2010 | Peng et al. |
| 7,697,296 B2 | 4/2010 | Floyd et al. |
| 2003/0159806 A1 | 8/2003 | Sehmbey et al. |
| 2007/0215321 A1 | 9/2007 | Yang et al. |
| 2009/0194252 A1 | 8/2009 | Lee et al. |

* cited by examiner

HEAT EXCHANGER BACKING PLATE AND METHOD OF ASSEMBLING SAME

CROSS-REFERENCE TO RELATED APPLICATIONS

This application claims priority to U.S. Provisional Patent Application No. 61/601,585 filed Feb. 22, 2012, the content of which is incorporated herein by reference in its entirety.

BACKGROUND

Electronic devices can generate a large amount of unwanted heat, which if not properly dissipated can adversely impact such devices. One way to dissipate the heat is by circulating air with a fan. Where air cannot be readily circulated and/or in cases where the air in not sufficiently clean, however, the heat from an electronic device can be dissipated by securing the electronic device to a heat removal device such as a heat pipe or thermosyphon. These heat removal devices typically include an evaporator, a condenser, and a heat dissipating feature such as a fin or other exterior surface of the heat removal device. For efficient heat dissipation, it is desirable to have the electronic device in contact with the evaporator, and the condenser in contact with the heat dissipating feature. However, the force required to secure the heat removal device to the electronic device sufficiently to achieve a desired level of thermal conductivity can sometimes deform or damage the heat removal device.

SUMMARY

Some embodiments of the present invention provide a backing plate for joining a heat removal device to a heat source. The backing plate includes a planar plate region having a first face and a second face opposite the first face, and at least one boss projecting from the first face, the boss having an opening therein for receiving a fastener.

In some embodiments, a backing plate for joining a heat removal device to a heat source with a fastener is provided, wherein the heat removal device has a first side and a second side. The backing plate includes a base having a first surface facing the first side of the heat removal device when secured thereto, and a second surface facing away from the heat removal device when secured thereto, and a boss extending along a longitudinal axis away from the base and toward the heat removal device when secured thereto, the boss shaped to releasably engage with the fastener from the second side of the heat removal device to clamp the heat removal device between the base of the backing plate and the fastener, and wherein the base has a footprint larger than a cross-sectional area of the boss taken in a plane orthogonal to the axis to distribute axial force from the boss across the first side of the heat removal device when secured thereto.

Some embodiments of the present invention provide a method of assembling a heat removal device onto a heat source. The method includes steps of providing a heat removal device having an evaporator side and a condenser side and at least one aperture defined therethrough, the aperture extending between the evaporator side and the condenser side of the heat removal device; disposing a backing plate against the condenser side of the heat removal device, the backing plate including at least one boss sized to fit within the at least one aperture, the boss adapted to mate with a fastener; disposing the evaporator side of the heat removal device against the heat source; inserting the at least one boss into the at least one aperture; passing the fastener through the heat source; and attaching the fastener to the boss to secure the backing plate and the heat removal device to the heat source.

In some embodiments, an electronic device is provided. The electronic device includes an electrical heat source; a heat removal device having a first side, a second side opposite the first side, and a vapor chamber; a backing plate on the first side of the heat removal device and having a boss extending at least partially through the vapor chamber; and a fastener extending at least partially through the vapor chamber from the second side of the heat removal device and secured to the boss, wherein the heat removal device is clamped between the fastener and the backing plate, which cooperate to exert a compressive load upon the heat removal device.

Other aspects of the invention will become apparent by consideration of the detailed description and accompanying drawings.

DETAILED DESCRIPTION

Before any embodiments of the invention are explained in detail, it is to be understood that the invention is not limited in its application to the details of construction and the arrangement of components set forth in the following description or illustrated in the accompanying drawings. The invention is capable of other embodiments and of being practiced or of being carried out in various ways.

Aspects of the present invention relate to a backing plate that can secure a heat removal device to a heat source (e.g., a circuit board, one or more microprocessors, and the like) with a high level of force without damaging or unacceptably deforming the heat removal device. In some embodiments, the backing plate includes a generally planar body to distribute the force required to couple the heat removal device to the heat source over an area larger than the cross-sectional area of the fastening locations of the heat source and heat removal device, thereby preventing unacceptable deformation of the heat removal device.

The heat source can include, for example, an insulated-gate bipolar transistor (IGBT) or other type of circuit boards. In this regard, the heat sources can include diffuse sources of heat as well as point sources of heat (e.g., CPUs on a circuit board).

Heat removal devices such as a heat pipe (whether in the form of a plate-type heat spreader, an elongated closed pipe, or any other shape or form), a thermosyphon, or any other heat removal device having a vapor chamber, an evaporator adjacent the heat source, and a condenser typically opposite the evaporator, can be used in conjunction with the backing plate of the present invention. In many cases, the heat removal devices are sealed under vacuum and contain a small amount of working fluid such as water, ethanol, methanol, or ammonia, which evaporates at the evaporator surface and condenses at the condenser surface, transferring heat away from the heat source.

In some embodiments, a heat-dissipating device can be secured to the condenser of the heat removal device for dissipating heat to a body of cooling fluid (e.g., to the environment, a flowing or convective body of fluid, and the like), to another heat exchange device, and the like. By way of example only, the heat-dissipating device can be a set of fins of any type, such as those shown in FIG. 1.

According to various embodiments, the disclosed backing plate structure, which can also be referred to as a bolster plate, can include bosses that extend into through holes in the heat removal device to receive fasteners from the evaporator side of the heat removal device. The bosses permit the heat removal device to be tightly secured to the heat source by bearing a relatively high level of force while preventing damage to the heat removal device.

Figure 1:
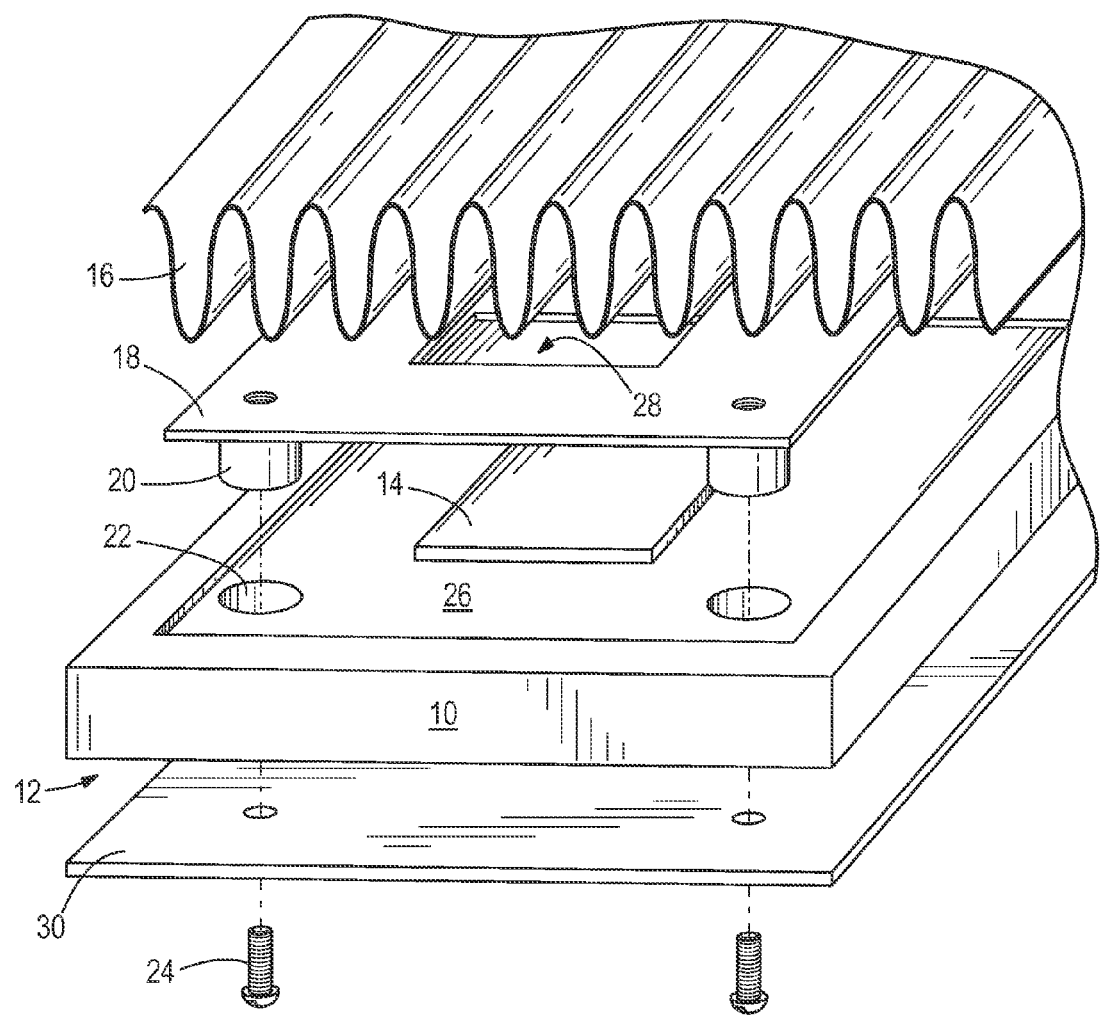
FIG. 1 shows an exploded view of an embodiment of a vapor chamber backing plate adjacent to a circuit board.
Figure 2:
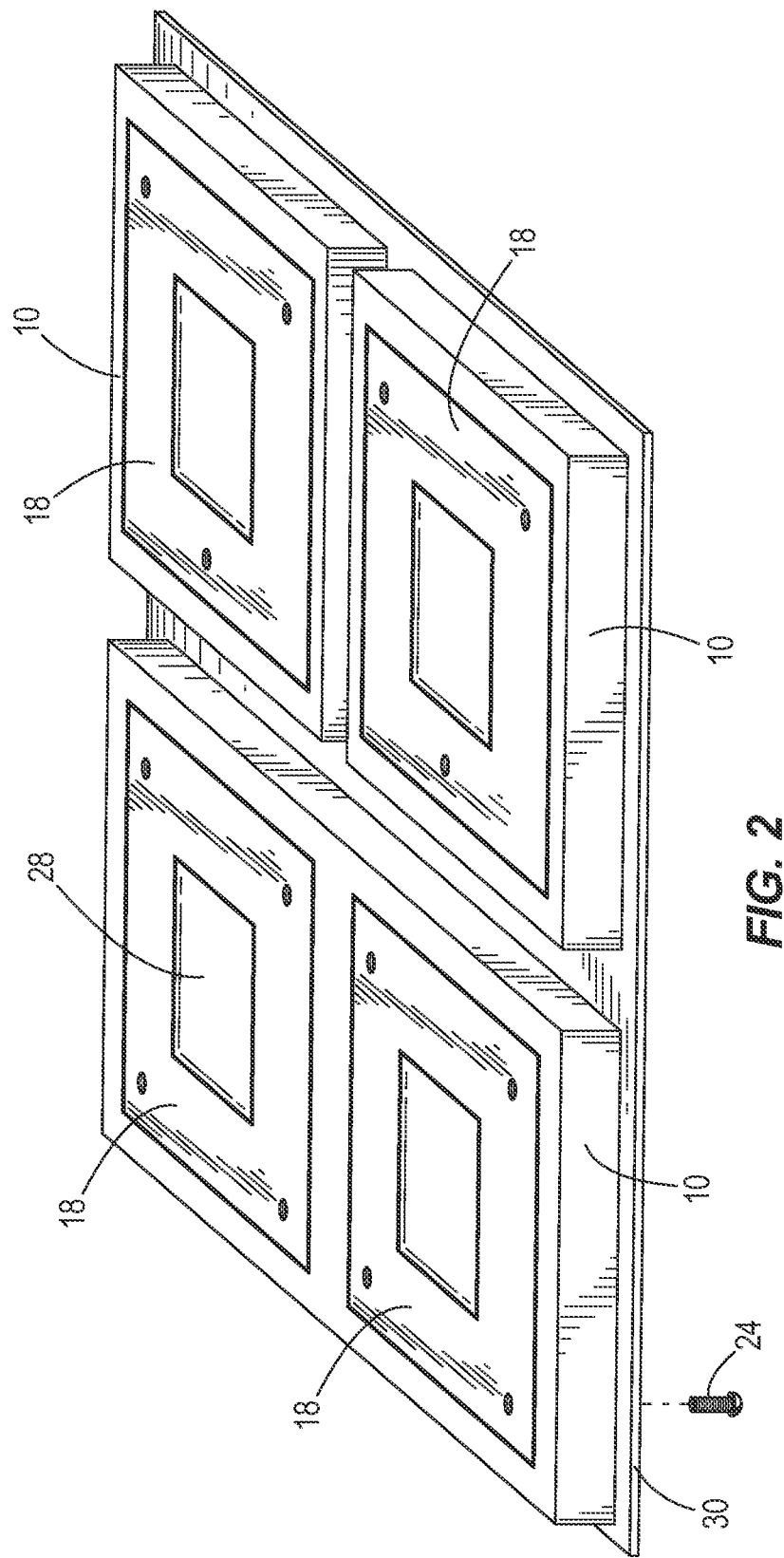
FIG. 2 shows a heat source having several heat removal devices attached thereto.

FIG. 1 is an exploded view of an embodiment of a heat removal device 10 according to the present invention. The heat removal device 10 includes an evaporator 12 and a condenser 14, either or both of which can be defined by structure of the heat removal device 10 at which working fluid within the heat removal device 10 evaporates and condenses, respectively, in operation of the device 10. In various embodiments, the heat removal device 10 can also have a heat-dissipating device 16 such as a fin attached thereto. FIG. 2 also shows a heat source 30 (e.g., a circuit board in the illustrated embodiment) having three separate heat removal devices 10 attached thereto, where one of the heat removal devices (FIG. 2, left) has two separate backing plates 18 attached to the condenser 14 side. In the embodiment of FIG. 2, a fastener 24 (e.g., a screw as shown, by way of example only) can be attached through an aperture in the heat source 30 to attach the backing plate 18 and the heat removal device 10 to the heat source 30, such that the heat source 30 is clamped between the backing plate and the fastener 24. In this manner, the fastener 24 and backing plate 18 can exert a compressive force upon each heat removal device 10, and in some embodiments can also exert a compressive force upon the heat source 30 and the heat removal device 10 to improve heat conduction across the interface therebetween.

Figure 3:
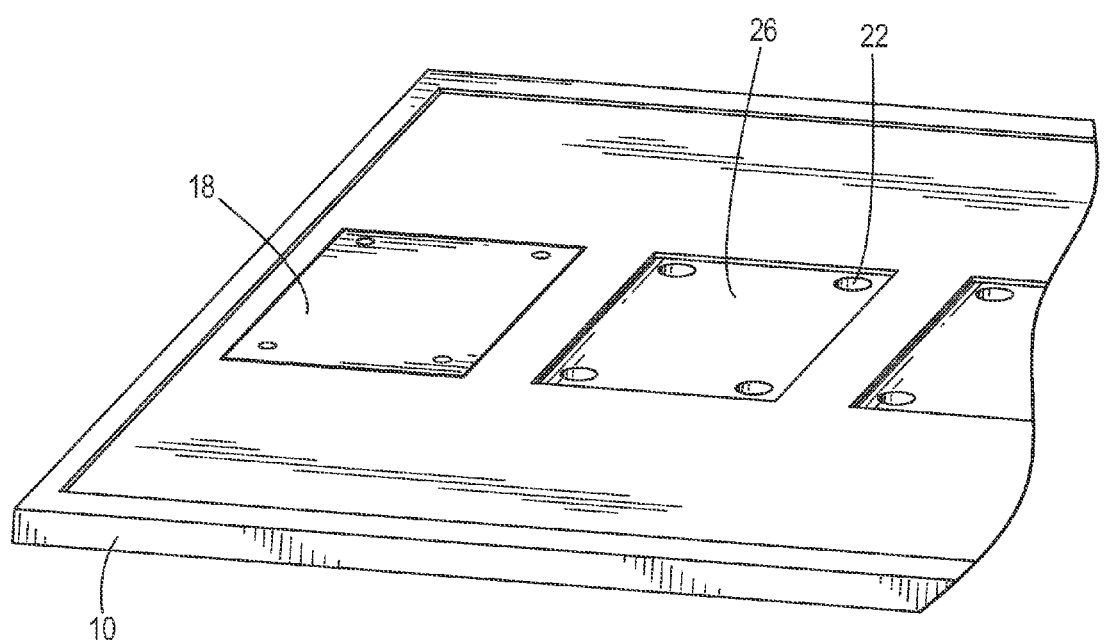
FIG. 3 shows the condenser side of a heat removal device with space for multiple backing plates, where a single backing plate without windows is installed.

In some embodiments, any or all of the backing plates 18 can be coupled to shared or respective (dedicated) heat dissipation devices 16 such as sets of fins (omitted from FIG. 2 for clarity). FIG. 3 shows a heat removal device 10 having space for multiple backing plates 18, where a backing plate 18 is installed (left) in one location while another location is unoccupied (right). By securing a heat dissipating device 16 to the backing plate 18 rather than directly to the condenser side of the heat removal device 10, it is possible to remove the heat dissipating device 16 by removing the fasteners 24 thereof, and then removing the backing plate 18 with the heat dissipating device 16 attached thereto. This capability can also provide the ability to access, maintain, repair, remove, and replace one heat source (e.g., one circuit board sharing the same heat removal device 10 with one or more other circuit boards) or portion of a heat source (e.g., a microprocessor or electronic element on a heat source 30 having several) without disturbing others.

In certain embodiments, the heat removal device 10 can be formed of annealed copper. However, while annealed copper is well-suited to many applications due to its heat-conducting properties, annealed copper (and a number of other otherwise desirable materials) is relatively soft. As a result, the heat removal device 10 can bend or compress under high levels of force that are sometimes required to couple the heat removal device 10 to a heat source 30, particularly in those cases where compressive force is desired to increase thermal conductivity between the heat source 30 and the heat removal device 10. Thus, a backing plate 18 can be disposed adjacent the condenser 14 of the heat removal device 10 to spread the force required to couple the heat removal device 10 to the heat source 30 in a thermally-conductive manner (see FIGS. 1, 2, and 3). As described further below, the backing plate 18 can have a variety of sizes and shapes, and can cover any amount of the surface of the condenser 14. Nevertheless, in certain embodiments where particularly high levels of force are applied, the components can be stressed and deformed even with the use of a backing plate 18.

Therefore, in certain embodiments the backing plate 18 can further include one or more bosses 20 extending from one face of the backing plate (e.g., extending from a base of the backing plate 20) and which extend into respective apertures through the heat removal device 10 (i.e., through-holes 22 of the heat removal device) to receive fasteners 24 for fastening to the heat source 30 (FIG. 1). In some embodiments, the bosses 20 have a length that is comparable to the depth of the through holes 22, or a length that is less than the depth of the through holes 22. The number of through holes 22 and bosses 20 that are used depends on factors such as the sizes and shapes of the heat source 30, the backing plate 18, and the heat removal device 10, as well as the distribution of individual point sources of heat on the heat source 30.

In some embodiments, the backing plate 18 includes one or more openings or windows 28 which, among other advantages, reduce the weight of the backing plate 18 (FIGS. 1 and 2).

Also, in some embodiments, the backing plate 18 can be at least partially received within a recess 26 on the condenser side of the heat removal device 10. For example, in those embodiments in which the backing plate 18 has a base that is substantially plate-shaped from which the bosses 20 extend as described herein, the base can be at least partially received within the recess. In some embodiments, the base of the backing plate is recessed within the condenser side of the heat removal device so that the surface of the backing plate 18 opposite the bosses 20 and adjacent exterior surfaces of the condenser side of the heat removal device 10 are co-planar or substantially co-planar. In this manner, a heat dissipating device 16 can be more readily attached to adjacent co-planar surfaces of the backing plate 18 and the heat removal device 10, or can otherwise simultaneously be in contact with such surfaces.

In those embodiments of the present invention having a backing plate 18 with a window 28 (whether the backing plate 18 is recessed within the condenser 14 as described above or not), any part of the condenser 14 can extend into the window 28. In such embodiments, a heat dissipating device 16 (e.g., a fin, as described above) can be in contact with the condenser 14 which extends upward through the window 28 (FIG. 1). Alternatively, the window can be unoccupied by any portion of the condenser 14, in which case a heat dissipating device 16 can be shaped to extend into the window 28 in those embodiments where direct contact between the heat dissipating device 16 and the condenser 14 is desired.

When the heat removal device 10 is fully assembled, the fasteners 24 run through the heat source 30 and attach to the bosses 20, tightly joining together the heat source 30, the heat removal device 10, the backing plate 18, and the heat dissipating mechanism 16 (e.g., fin) if used, in a thermally-conductive manner.

The backing plate 18 (i.e., the base of the backing plate 18) can have various shapes, such as rectangular, square, circular, triangular, any other regular or irregular polygons, or irregular shapes. Similarly, the window 28 can be various shapes, such as rectangular, square, circular, triangular, any other regular or irregular polygons, or irregular shapes. Further, the backing plate 18 can have more than one window 28, and each window 28 can have the same or different shapes.

FIG. 1 shows a plurality of bosses 20 on a single backing plate 18, although the backing plate 18 can have as few as one boss 20. In some embodiments, a backing plate 18 with one boss 20 can be preferred because it is simple in construction and can reduce the cost of manufacturing. However, a backing plate 18 with two or more bosses 20 can alternatively be preferred because load can be distributed more evenly across a larger face of the backing plate 18, and/or because the backing plate 18 can be held more firmly in place and can be less prone to twisting or rotating when there is more than one boss 20. Each boss 20 can be cylindrically shaped, but can also have any number of other cross-sectional shapes including, but not limited to, circular, rectilinear (square or otherwise), elliptical, or any other regular or irregular polygonal shapes such as star shapes or other shapes having three or more sides where the faces of the shapes include convex and/or concave portions. As used herein and in the appended claims, the cross-sectional shapes are defined in a plane extending through the boss 20 and that is orthogonal to the longitudinal axis of the boss 20.

A given backing plate 18 can include a combination of bosses 20 having various sizes and shapes. Also, in some embodiments, one or more of the through holes 22 in the heat removal device 10 can be sized to receive the fasteners 24 alone, without a boss 20.

In some embodiments, each boss 20 can be tapered along at least a portion of its length such that it is wider at the point where it connects to the backing plate 18. Also, each boss 20 can be adapted to receive a particular type of fastener 24. For example, the bosses 20 can be internally threaded to receive fasteners 24 such as screws. In other embodiments, each boss 20 is adapted to mate with or otherwise be secured to a respective fastener in any other suitable manner, such as an externally-threaded boss received within a threaded aperture (e.g., blind hole) of a fastener 24, bosses 20 that are brazed or soldered to fasteners 24 under compression during joining operations (e.g., by a temporary frame, brace, or other structure), and the like.

In embodiments with a plurality of bosses 20, each boss 20 can have a similar size and shape, but in some embodiments one or more bosses 20 can have a different size or shape than the other bosses 20 to facilitate accurate alignment of the backing plate 18 onto the heat removal device 10. In some embodiments, a plurality of bosses 20 (and their associated through holes 22) are arranged in a rectangular grid or a non-rectangular pattern to suit the layout of the heat source 30 (e.g., circuit board) and/or the heat removal device 10. Bosses 20 can also be evenly spaced across the heat source 30, or can be more unevenly spaced as desired (i.e., to be more closely spaced in desired areas). In the case where the heat source 30 is a circuit board, the bosses 20 and their associated fasteners 24 can be located so as to accommodate the placement of devices such as chips, while ensuring that regions of the circuit board which have higher heat production, such as where a CPU is located, are near one or more bosses 20 to ensure improved a thermally conductive connection with the heat removal device 10.

In some embodiments, the backing plate 18 is formed of a material that is stronger than that of the heat removal device. By way of example only, the backing plate 18 can be formed of stainless steel. The bosses 20 can be formed of metals with good thermal conductivity, such as copper or aluminum, and can be made of the same or different material than the base of the backing plate 18. For improved thermal conductivity, gold- or silver-plated metals can be used for the backing plate 18 and/or the bosses 20. In some embodiments, the backing plate 18 measures 2-50 cm in a length dimension, and 2-50 cm in a width dimension. Also in some embodiments, the thickness of the base of the backing plate 18 can be from about 1 mm to about 10 mm. In various embodiments, the backing plate 18 is dimensioned so as to cover at least a portion of an insulated-gate bipolar transistor (IGBT) on a circuit board. While FIG. 1 shows a heat removal device 10 which includes one backing plate 18, in some embodiments (FIG. 2) the heat removal device 10 can include a plurality of backing plates 18 which are distributed across the condenser 14 side of the heat removal device 10, where each of the backing plates 18 can be the same or a different shape, each may or may not have one or more windows 28, and each may or may not be partially or fully received within a respective matching recess 26 of the heat removal device 10.

As mentioned above, among other considerations, having multiple backing plates 18 on a single heat removal device 10 can permit individual backing plates 18 to be removed and replaced separately. This can be beneficial where one or more fins or other heat-dissipating mechanisms 16 are coupled to the backing plates 18 and can need to be replaced if they are damaged. In yet another embodiment (FIG. 2), there can be multiple heat removal devices 10, each with a separate backing plate 18, on a given heat source 30, in some cases enabling removal and replacement of a heat removal device 10 from the heat source 30 without disturbing other heat removal devices 10 secured to the heat source. Each of the heat removal devices 10 and associated backing plates 18 can have different sizes and shapes, and can have varying numbers of bosses 20 and windows 28 depending on factors such as the size, shape, and distribution of point sources of heat on the heat source 30.

In various embodiments, the length of each boss 20 is set so as to be flush with the evaporator surface of the heat removal device 10 in the assembled state. In general, the length of a boss 20 can be comparable to the depth of the through hole 22 in which the boss 20 is intended to be received. The depth of the through hole 22, in turn, can be generally the same as the thickness of the heat removal device 10, minus the depth of the recess 26, if present. In some embodiments, the bosses 20 are initially produced slightly longer than required. The backing plate 18 with such bosses 20 is then assembled into the heat removal device 10, and the protruding ends of the bosses 20 are trimmed (e.g. by a flycut) so as to be flush with the evaporator surface of the heat removal device 10. Each boss can have a cross sectional area which is large enough to distribute the compressive load exerted by the fasteners 24. Accordingly, each boss 20 can measure 2 mm to 25 mm in length, and 1 mm to 25 mm in diameter. In some embodiments in which the heat removal device 10 can withstand limited compressive forces, each boss 20 can be dimensioned so as to be slightly recessed relative to the evaporator 12 or the condenser 14.

By virtue of the relative size of the boss 20 and the backing plate base from which the boss extends, axial force from the boss 20 (experienced when the fastener 24 is tightened to clamp the heat removal device 10 between the backing plate 18 and the fastener 24, and in some embodiments between the backing plate 18 and the heat source 30) is distributed across the backing plate base and therefore across a condenser surface of the heat removal device 10. The backing plate base can have a footprint that is larger than the cross-sectional area of the boss 20 to enable this distribution. This force distribution reduces the likelihood of heat removal device deformation and damage, and can improve heat exchange between the heat source 30 and the heat removal device.

In some embodiments, the bosses 20 are formed separately from the backing plate 18 and are attached to the backing plate 18 in any suitable manner, such as by brazing, soldering, or welding. In some embodiments, the bosses 20 can be attached to the backing plate 18 by fasteners such as screws or rivets, which can facilitate later removal of the bosses 20 from the backing plate 18, if desired.

In still other embodiments, the bosses 20 can be separate from and not be attached to the base of the backing plate 18. In such embodiments, the bosses 20 can be inserted into the through holes 22 during assembly and, like the attached bosses 20, would also serve the purpose of resisting compressive forces applied by the fasteners 24. In the embodiments in which the bosses 20 are not attached to the base of the backing plate 18, it is desirable to use fasteners 24 which attach at both ends, e.g. rivets, screws with nuts, or other similar types of fasteners 24. Alternatively, the backing plate itself could be threaded to accept fasteners 24 such as screws while the bosses 20 could be threaded or unthreaded.

Alternatively, in certain embodiments, the bosses 20 can be integral with the base of the backing plate 18. The combined backing plate base and bosses 20 can be formed by casting in some embodiments. In other embodiments, however, the combined backing plate base and bosses 20 can be formed by shaping a block of a metal, for example using one or more of milling, grinding, laser cutting, stamping, plasma cutting, and high pressure water jets cutting, to provide a single element having dimensional precision and stability. In still other embodiments, the combined backing plate base and bosses 20 can be molded using a thermally-conductive polymer.

Various types of fasteners 24 can be used, where the fasteners 24 generally have an elongated shaft with a head portion at one or both ends, and where at least a portion of the head extends laterally away from the shaft. The fasteners 24 can be secured in place in various ways, where the method of securing affects how readily the fasteners 24 can be removed. For example, the fasteners 24 can be screws, rivets, or pins with barbed shafts. One or both ends of the fastener (depending on the type of the fastener used) can also include a washer or other element under the head of the fastener for distributing force of the head of the fastener 24 over a broader area of the backing plate 18 or the heat source 30, as applicable, in order to prevent stressing and possible damage to the respective structure. One or both of the respective surfaces of the backing plate 18 and the heat source 30 can be recessed or countersunk so that the head(s) of the fasteners 24 are flush or recessed relative to the nearby surface.

Varying levels of force can be applied to the fasteners 24. In some embodiments, the fasteners 24 are tightened so as to bring together the heat source 30, the heat removal device 10, and the backing plate 18 (often having one or more heat-dissipating devices 16 attached thereto as described above) in thermally-conductive contact with one another. The use of bosses 20 permits an even higher level of force to be applied to the fasteners 24 without damaging (e.g. cracking, deforming, or compressing) the heat source 30, the backing plate 18, or the heat removal device 10. In some embodiments, the fastener 24 can be tightened under 40 inch-pounds (in-lbs) of torque such that the total force exerted by the fastener 24 is 1052 pounds. In various embodiments, a single fastener 24 can be tightened under at least 50 in-lbs of torque, although other torque values are possible. In those embodiments with backing plates 18 having bosses, the amount of force applied to a single fastener 24 can be increased without causing damage to the heat source 30, the heat removal device 10, or the backing plate 18.

As described above, in some embodiments, each backing plate 18 has one or more heat dissipation devices 16 such as a set of fins coupled thereto. In some embodiments, each heat-dissipating device 16 can be secured to the backing plate 18, such as by brazing, soldering, or welding. In other embodiments, the heat-dissipating device 16 can be attached to the backing plate 18 by fasteners 24 such as screws, rivets, or barbed pins. In still other embodiments, the heat-dissipating device 16 can be attached (also by means such as brazing, soldering, or welding) to the heat removal device 10 instead of, or in addition to, the backing plate 18. With various manners of attachment, however, the heat-dissipating device 16 can be permanently secured or can be removed from the backing plate 18 or heat removal device 10.

In some embodiments, the backing plate 18 can be more permanently attached to the heat removal device 10, for example by welding, soldering, or brazing together the parts described above. While this could make disassembly more difficult, it would have the advantage of making a connection with very high thermal conductivity.

As disclosed herein, various embodiments of the present invention also include methods of replacement of one or more backing plates 18 from a heat source 30 and heat removal device 10. In various embodiments, the heat removal device 10 and the backing plate 18, with optional bosses 18 and fins 16 (or other heat-dissipating elements) attached thereto, are attached to the heat source 30 in a manner that facilitates rapid assembly, disassembly, removal, and replacement, for example using screws as fasteners 24. Replacement can also be facilitated by having several individual backing plates 18, heat removal devices 10, and/or heat dissipating mechanisms 16 in a system (e.g., see FIGS. 2 and 3), which can be individually removed and replaced as needed without having to completely remove a single large component.

In some embodiments, the present invention provides a method of assembling a heat removal device 10 onto a heat source 30. The method can include steps of: providing a heat removal device 10 having an evaporator 12 side and a condenser 14 side and at least one through hole 22 therein, the through hole 22 extending between the evaporator 12 side and the condenser 14 side of the heat removal device 10; disposing a backing plate 18 against the condenser 14 side of the heat removal device 10, the backing plate 18 including at least one boss 20 sized to fit within the at least one through hole 22, the boss 20 being adapted to receive a fastener 24; disposing the evaporator 12 side of the heat removal device 10 against the heat source 30; inserting the at least one boss 20 into the at least one through hole 22; and passing the fastener 24 through the heat source 30 and into the boss 20 to secure the backing plate 18 and the heat removal device 10 to the heat source 30. In some embodiments, the backing plate 18 can also include a heat-dissipating mechanism 16 such as a fin attached thereto.

What is claimed is:

1. A backing plate for joining a heat removal device to a heat source, the backing plate comprising:
   a planar plate region having a first face and a second face opposite the first face; and
   at least one boss projecting from the first face, the boss having an opening therein for receiving a fastener, wherein the at least one boss extends into the heat removal device, the fastener extends through the heat source, and the heat removal device is disposed between the heat source and the backing plate.

2. The backing plate of claim 1, further comprising a fin attached to the second face.

3. The backing plate of claim 1, further comprising an opening in the planar region.

4. The backing plate of claim 1, wherein the fastener is a screw.

5. The backing plate of claim 1 further comprising a plurality of bosses each shaped to releasably engage with a fastener extending from the heat removal device.

6. The backing plate of claim 1, wherein the backing plate is sized to fit within a recess defined in a surface of the heat removal device.

7. The backing plate of claim 1, wherein the fastener is attached to the at least one boss to secure the backing plate to the heat removal device.

8. The backing plate of claim 1, wherein the heat removal device is clamped between the fastener and the backing plate.

9. The backing plate of claim 8, wherein the heat source is also clamped between the fastener and the backing plate.

10. The backing plate of claim 1, wherein the heat removal device is fixed between the heat source and the backing plate.

11. A backing plate for joining a heat removal device to a heat source with a fastener, the heat removal device having a first side and a second side, the backing plate comprising:
a base having a first surface facing the first side of the heat removal device when secured thereto, and a second surface facing away from the heat removal device when secured thereto; and
a boss extending along a longitudinal axis away from the base and at least partially through the heat removal device towards the second side of the heat removal device when the base is secured to the heat removal device, the boss shaped to releasably engage with the fastener from the second side of the heat removal device to clamp the heat removal device between the base of the backing plate and the fastener, wherein the fastener extends through the heat source,
wherein the base extends beyond a cross-sectional area of the boss taken in a plane orthogonal to the longitudinal axis of the boss to distribute axial force from the boss across the first side of the heat removal device when secured thereto, and wherein the heat removal device is disposed between the heat source and the backing plate.

12. The backing plate of claim 11, wherein the fastener is a screw.

13. The backing plate of claim 11, wherein the boss is one of a plurality of bosses each extending along a respective axis away from the base and toward the heat removal device when secured thereto, each of the plurality of bosses shaped to releasably engage with a respective fastener from the second side of the heat removal device.

14. The backing plate of claim 13, wherein an aperture is defined through the backing plate between at least two of the bosses.

15. The backing plate of claim 11, wherein the heat removal device is fixed between the heat source and the backing plate.

16. An electronic device, comprising:
an electrical heat source;
a heat removal device having a first side and a second side opposite the first side;
a backing plate on the first side of the heat removal device and having a boss extending at least partially through the heat removal device from the first side towards the second side; and
a fastener extending through the heat source and at least partially through the heat removal device from the second side of the heat removal device and secured to the boss,
wherein the heat removal device is clamped between the fastener and the backing plate.

17. The electronic device of claim 16, wherein the electrical heat source is also clamped between the fastener and the backing plate.

18. The electronic device of claim 16, wherein:
the backing plate further comprises a plate from which the boss extends; and
the plate is recessed within the heat removal device.

19. The electronic device of claim 16, further comprising a heat dissipating device secured to the backing plate, wherein the backing plate is located between the heat dissipating device and the heat removal device.

20. A system for joining a heat removal device to a heat source, the system comprising:
a heat removal device having a first side and a second side and at least one aperture extending between the first side and the second side of the heat removal device, wherein the second side of the heat removal device is adjacent the heat source; and
a backing plate disposed adjacent the first side of the heat removal device, the backing plate including at least one boss sized to fit within the at least one aperture, wherein the boss extends at least partially through the heat removal device and is adapted to receive a fastener to couple the backing plate to the heat source, wherein the fastener extends through the heat source.

21. The system of claim 20, further comprising a recess defined in the first side, wherein the backing plate is sized to fit within the recess.

22. The system of claim 20, wherein the fastener is attached to the boss to secure the backing plate to the heat source.

23. The system of claim 20, wherein the heat removal device is clamped between the fastener and the backing plate.

24. The backing plate of claim 23, wherein the heat removal device is clamped between the fastener and the backing plate.

* * * * *